(12) United States Patent
Kuwajima et al.

(10) Patent No.: US 7,312,955 B2
(45) Date of Patent: Dec. 25, 2007

(54) DISK DRIVE PIEZOELECTRIC ACTUATOR WITH COUPLING PORTION EXTENDING ACROSS A SLIT BETWEEN FLEXIBLE SUBSTRATES

(75) Inventors: Hideki Kuwajima, Kyoto (JP); Kaoru Matsuoka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 351 days.

(21) Appl. No.: 10/684,403

(22) Filed: Oct. 15, 2003

(65) Prior Publication Data
US 2004/0130831 A1 Jul. 8, 2004

(30) Foreign Application Priority Data
Oct. 16, 2002 (JP) ............................. 2002-301604

(51) Int. Cl.
*G11B 5/596* (2006.01)
*G11B 21/10* (2006.01)
*H01L 41/09* (2006.01)
*H02N 2/04* (2006.01)

(52) U.S. Cl. .................................. 360/294.4; 310/331
(58) Field of Classification Search ............. 360/294.4, 360/291.9; 310/331, 332, 366
See application file for complete search history.

(56) References Cited

U.S. PATENT DOCUMENTS

| 5,187,458 | A | | 2/1993 | Yamashita et al. | |
|---|---|---|---|---|---|
| 5,764,444 | A | * | 6/1998 | Imamura et al. | ......... 360/294.4 |
| 6,157,522 | A | | 12/2000 | Murphy et al. | |
| 6,327,120 | B1 | * | 12/2001 | Koganezawa et al. | ... 360/294.4 |
| 2001/0021086 | A1 | * | 9/2001 | Kuwajima et al. | ....... 360/294.4 |
| 2002/0012194 | A1 | * | 1/2002 | Inagaki et al. | ........... 360/78.08 |
| 2002/0017014 | A1 | | 2/2002 | Takeuchi et al. | |
| 2002/0048124 | A1 | * | 4/2002 | Kuwajima et al. | ....... 360/294.4 |
| 2002/0121941 | A1 | | 9/2002 | Sakata et al. | |
| 2003/0223155 | A1 | * | 12/2003 | Uchiyama | ................. 360/294.4 |
| 2004/0100735 | A1 | * | 5/2004 | Nakatani et al. | .......... 360/294.4 |
| 2004/0114279 | A1 | * | 6/2004 | Kuwajima et al. | ....... 360/294.4 |

FOREIGN PATENT DOCUMENTS

EP 0 549 814 7/1993

(Continued)

OTHER PUBLICATIONS

Patent Abstracts of Japan, vol. 010, No. 347 (E-457), Nov. 21, 1986 & JP 61 150287 A, (Japan Storage Battery), Jul. 8, 1986, abstract.
Kuwajima, H., et al.: "Thin-Film Piezoelectric DSA For HDD", IEEE Transactions On Magnetics, IEEE Service Center, New York, NY, US, vol. 38, No. 5, Sep. 2002, pp. 2186-2188, XP001131574.

*Primary Examiner*—Craig A. Renner
(74) *Attorney, Agent, or Firm*—Wenderoth, Lind & Ponack, L.L.P.

(57) ABSTRACT

A piezoelectric actuator with a reinforced bending mode to suppress bending resonance caused by extension/contraction movements of the piezoelectric actuator and a disk drive using the piezoelectric actuator are provided. A flexible substrate is separated by a slit. A first piezoelectric element unit and a second piezoelectric element unit, both showing extension/contraction displacement, are disposed on one of the slit-separated flexible substrates, respectively. A coupling portion is provided to couple the separated flexible substrates across the slit. The coupling portion is provided at a position corresponding to an antinode of a primary bending mode of the first and second piezoelectric element units being respectively fixed in both ends.

16 Claims, 14 Drawing Sheets

FOREIGN PATENT DOCUMENTS

| | | |
|---|---|---|
| EP | 0 996 175 | 4/2000 |
| EP | 1 202 273 | 5/2002 |
| JP | 5-47126 | 2/1993 |
| JP | 2529360 | 6/1996 |
| JP | 8-305622 | 11/1996 |
| JP | 9-73746 | 3/1997 |

* cited by examiner

Driving voltage of thin film piezoelectric element driver wiring 9a

Driving voltage of thin film piezoelectric element driver wiring 9b

DISK DRIVE PIEZOELECTRIC ACTUATOR WITH COUPLING PORTION EXTENDING ACROSS A SLIT BETWEEN FLEXIBLE SUBSTRATES

FIELD OF THE INVENTION

The present invention relates to an actuator element made of a piezoelectric material characterized by a high elasticity upon applied electricity, and in particular, to a piezoelectric actuator element for use in head positioning means in a disk drive and the disk drive using the actuator.

BACKGROUND ART

The technology of disk drives has recently seen rapid progress in linear track recording density due to improvements of head device elements. Along with this trend, an increased recording density in a direction normal to the tracks becomes important to meet the much finer track pitch that is required. Then, a mechanism which is capable of driving a magnetic head with a finer scale is needed to follow the narrow track width accuracy.

The magnetic head for recording and playing data in a magnetic disk of the disk type data storage system is disposed in a head slider mounted on an actuator arm. A voice coil motor (or VCM) moves the actuator arm pivotally to position the magnetic head for a target location on a disk for reading data. Along with the progress in recording density, however, such a conventional way depending on VCM only has become insufficient to maintain enough accuracy in positioning the magnetic head. Consequently, an additional fine positioning means using a piezoelectric element has been proposed to be adopted as an auxiliary actuator to the conventional VCM system. The auxiliary positioning means moves the head slider to perform a fine displacement for positioning at target tracks on a disk with a high speed and accuracy (see Japanese Patent No. 2,529,360). Additionally, an example of a thin-film piezoelectric element being adopted as an auxiliary actuator is disclosed (see Japanese Patent Unexamined Publication No. H9-73746).

Now, the thin-film piezoelectric element to act as an auxiliary actuator is required to have down-sized dimensions and light weight, to make a large displacement with a low voltage apply, and to give no influence with respect to each other on movements of both main and auxiliary actuators.

The drawback is that no solution has been found in the conventional arts to solve the problems all together. Namely, to provide the auxiliary actuator with a larger resonance frequency than the main actuator and yet to create a large displacement, the auxiliary actuator must have a larger rigidity and needs to apply a higher driving voltage of some tens of voltages. Such a configuration causes not only a complicated actuator structure but also a large circuitry to drive, which results in a difficulty especially in applying the actuator for the downsized disk drive.

The present invention aims to solve the aforementioned problems and additionally to provide an actuator acting as an auxiliary actuator that can create a large displacement with a low voltage apply and can perform a stable operation under a bending mode that is caused by extension/contraction movements exerted from the actuator and the disk drive using the actuator.

SUMMARY OF THE INVENTION

The piezoelectric actuator disclosed in this invention comprises: (a) a flexible substrate partially separated by a slit; (b) a first piezoelectric element unit disposed on one of the separated flexible substrates; (c) a second piezoelectric element unit disposed on another separated flexible substrate that is approximately parallel with the first piezoelectric element unit; and (d) a coupling portion to couple the separated substrates across the slit.

This configuration according to the present invention can prevent a bending resonance phenomena that occurs in extension/contraction movements of the respective first and second piezoelectric element units to the opposite directions of each others because the structure reinforces the effects of the bending mode of the piezoelectric actuator.

BRIEF DESCRIPTION OF THE DRAWINGS

FIG. 13 (b) is a schematic view showing an applying voltage pattern to driving wiring 9a for the thin film piezoelectric actuator elements in accordance with the exemplary embodiment of the present invention.

FIG. 13 (c) is a schematic view showing an applying voltage pattern to driving wiring 9b for the thin film piezoelectric actuator elements in accordance with the exemplary embodiment of the present invention.

FIG. 15 (b) shows a frequency characteristics of a conventional piezoelectric actuator element.

FIG. 16 (b) shows a frequency characteristic of the piezoelectric actuator element.

DETAILED DESCRIPTION OF THE INVENTION

An exemplary embodiment of the present invention is described below with reference to the drawings.

Figure 1:
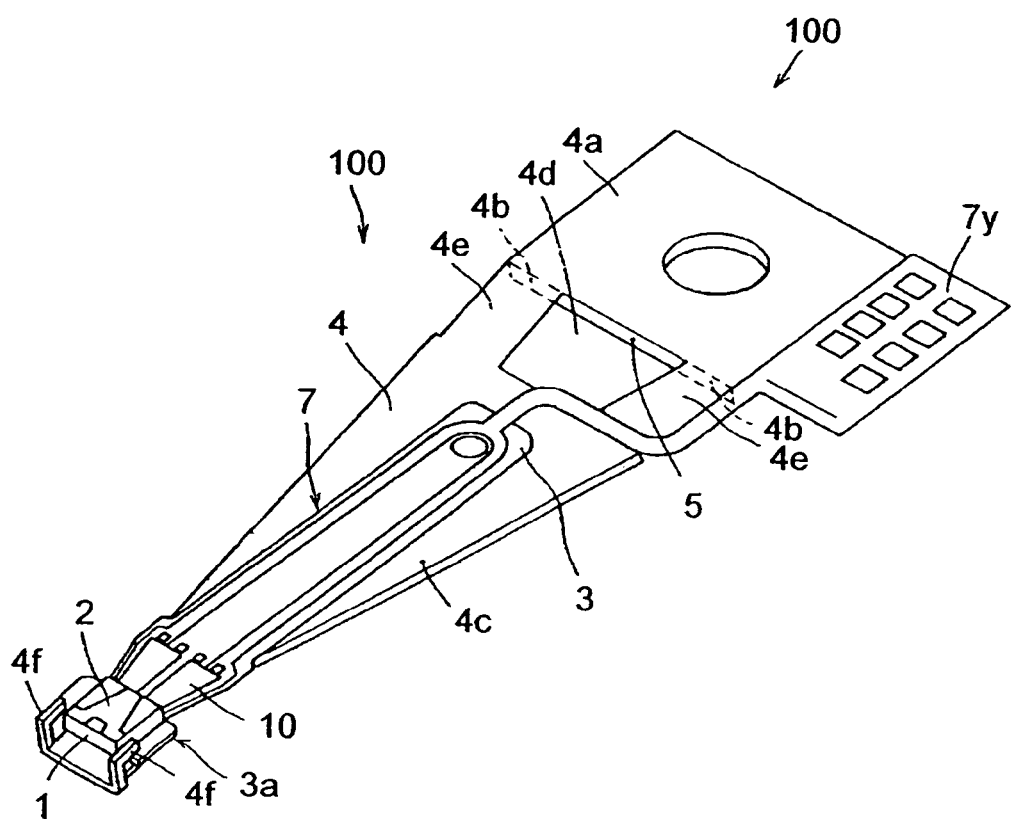
FIG. 1 is a perspective view of a head suspension assembly in accordance with an exemplary embodiment of the present invention.
Figure 2:
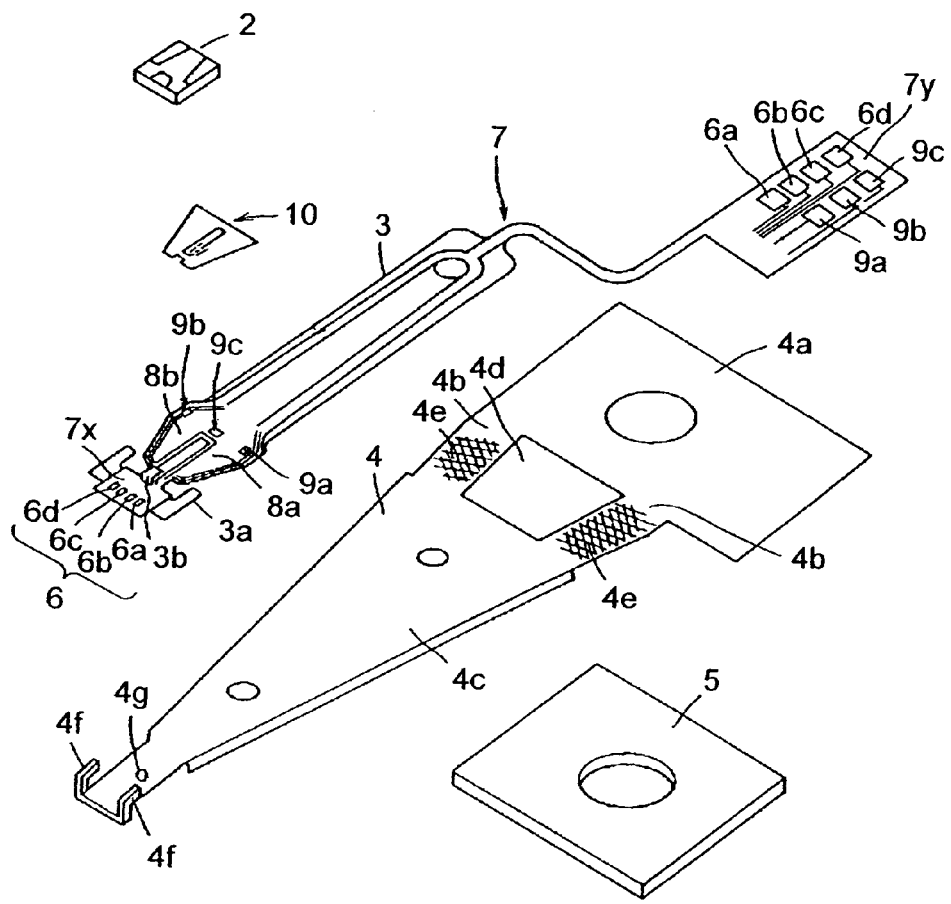
FIG. 2 is an exploded perspective view of the head suspension assembly.

FIG. 1 is a perspective view of a head suspension assembly provided with an actuator element having a piezoelectric actuator in accordance with the exemplary embodiment of the present invention. FIG. 2 is an exploded perspective view of the head suspension assembly, and FIG. 3 is a perspective view of a slider used in the head suspension assembly.

Figure 3:
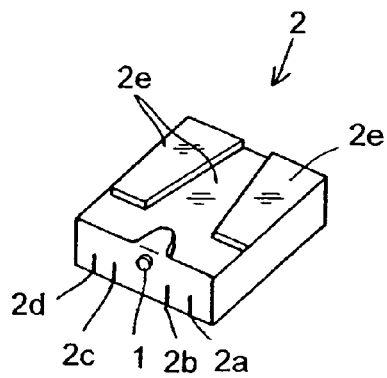
FIG. 3 is a perspective view of a slider used in the head suspension assembly.

Head suspension assembly 100 includes a load beam 4 having a slider 2, which is provided with, for instance, a magnetic head 1 on its distal end as shown in FIG. 1 to 3. Load beam 4 has a square shaped mounting portion 4a fixed to a head actuator arm (not shown), and mounting portion 4a is fixed to a base plate 5 by beam welding or the like. Base plate 5 is mounted to the aforementioned head actuator arm. Load beam 4 elongates from mounting portion 4a to a gradually narrow-shaped neck portion 4b, and is sequentially followed by a straight shaped beam 4c. Opening 4d is provided in the center of neck portion 4b to form a plate spring 4e. Rims 4f are provided on both sides at the distal end of beam 4c to stop pivotal motions of a slider holder 3a with a small gap.

The respective rims 4f elongate straightly from the distal end of beam 4c to the direction of mounting portion 4a. Flexure 7 having patterned wiring 6 is provided on beam 4c as shown in FIG. 2. The basic material of flexure 7 is stainless steal. Slider 2 equipped with magnetic head 1 is mounted on slider setting portion 7x provided on one end of flexure 7. In addition to this, piezoelectric actuator element 10 is disposed on thin film spaces 8a and 8b provided on flexure 7.

Four terminals 2a to 2d are disposed in parallel at the bottom surface of slider 2 equipped with magnetic head 1 as shown in FIG. 3. Moreover, air-bearing surface 2e is designed on the top surface of slider 2 to form a bearing film of air above the disk surface by air that is generated in rotation of disk (not shown) flowing in the pitch direction (tangential direction of the disk). A central point of air-bearing surface 2e corresponds to a dimple 4g of load beam 4.

Figure 4:
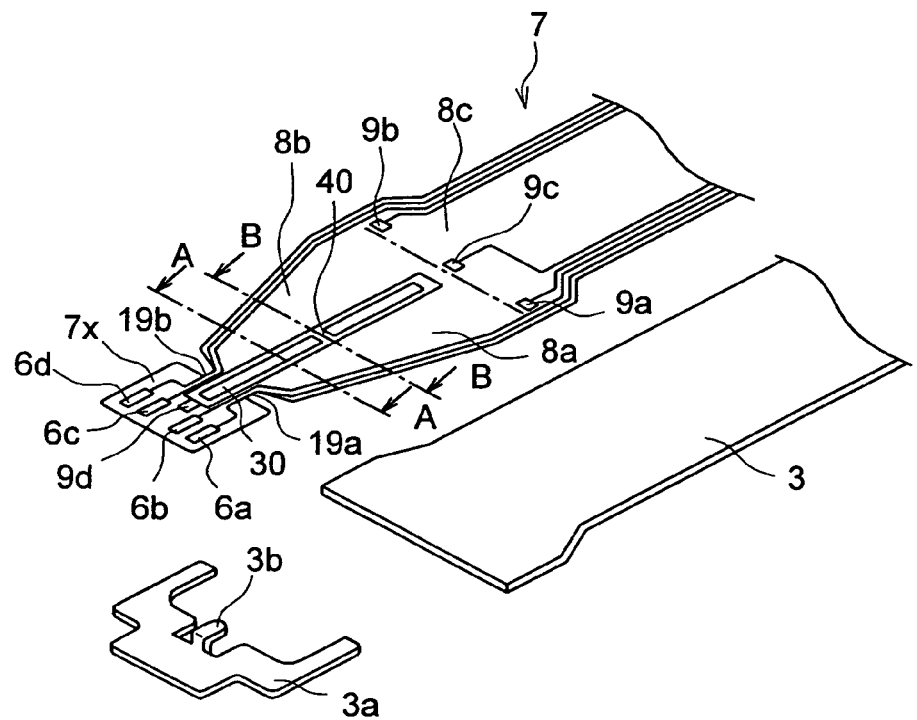
FIG. 4 is an exploded perspective view showing a configuration of a flexure used in the head suspension assembly.

FIG. 4 is an exploded perspective view showing a structure of the end portion of flexure 7, where slider 2 is mounted, used in head suspension assembly 100. Flexure 7 comprises a flexure substrate 3, which is made of stainless steel as a basic material to form the flexure body, a slider holder 3a and a resinous flexible substrate 8c, which is made of, for instance, polyimide or the like, as shown in FIG. 4. Flexure substrate 3 and coplanar slider holder 3a are bonded to the surface of flexible substrate 8c. Flexible substrate 8c thus couples flexure substrate 3 and slider holder 3a mechanically. Additionally, flexible substrate 8c is provided with a partially narrow width to form elastic hinge portions 19a and 19b. Hinge portions 19a and 19b are provided at the edge of flexure substrate 3 and slider holder 3a to couple both materials movably. Electrical wirings 6a, 6b, 6c and 6d are provided on slider setting portion 7x of flexible substrate 8c. In addition to this, thin film spaces 8a and 8b are provided on the tip of flexible substrate 8c separately across slit 30 in parallel with each other. Wirings 6a, 6b, 6c and 6d extend around thin film spaces 8a and 8b.

Ground wiring 9d for grounding the terminal of piezoelectric actuator element 10 is provided around slit 30, and slit 30 is partially connected by flexible substrate 8c to form coupling portion 40. Additionally, ground wiring 9d around slit 30 is provided such that wirings 41 of both sides of slit 30 are shorted on flexible substrate 8c of coupling portion 40. Projection 3b formed on slider holder 3a is pressed to touch dimple 4g provided near the top end of load beam 4. Since projection 3b is pressed to touch dimple 4g, slider holder 3a is held pivotally around dimple 4g as a center of rotation in all directions. Therefore, one end of thin film spaces 8a and 8b is bonded with rigid flexure substrate 3, which is made of stainless steel, and the other end of thin film spaces 8a and 8b is bonded with slider holder 3a, respectively.

External connection terminal 7y is provided on another end of flexure 7 as shown in FIG. 2. External connection terminal 7y is placed on a side opposite to a neck portion 4b of mounting portion 4a of load beam 4.

Figure 5:
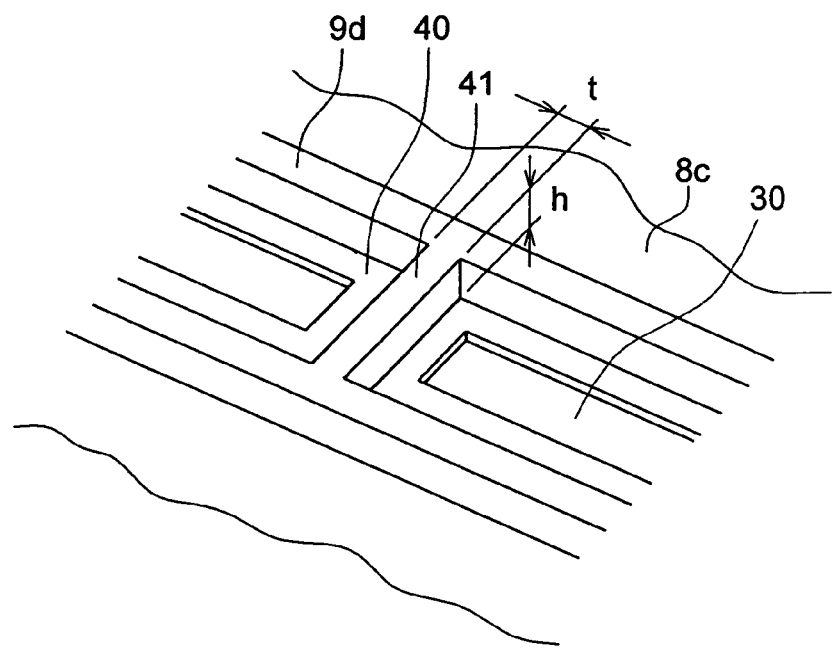
FIG. 5 is a partially enlarged perspective view showing a detailed structure of a coupling portion provided in the head suspension assembly.
Figure 6:
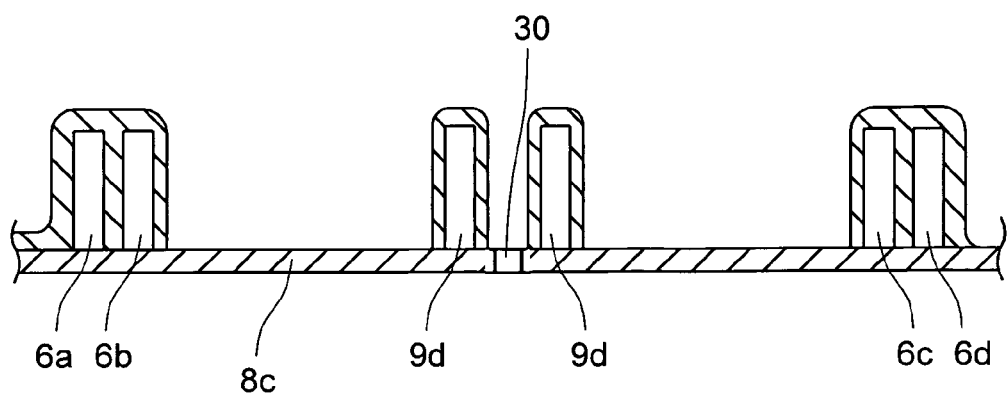
FIG. 6 is a cross-sectional view taken along the line A-A in FIG. 4.
Figure 7:
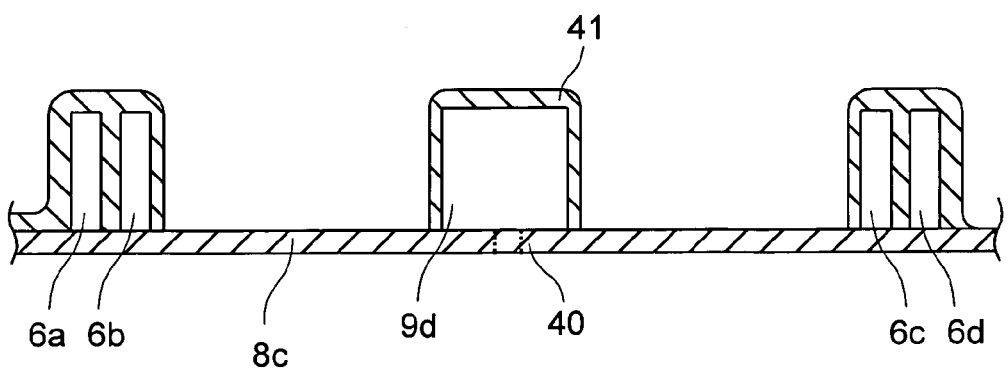
FIG. 7 is a cross-sectional view taken along the line B-B in FIG. 4.

FIG. 5 is a partially enlarged perspective view showing a detailed structure of coupling portion 40, FIG. 6 shows a cross-sectional view taken along the line A-A in flexible substrate 8c, and FIG. 7 shows a cross-sectional view taken along the line B-B in flexible substrate 8c. Coupling portion 40 is formed across slit 30 provided in flexible substrate 8c such that thin film spaces 8a and 8b equipped with piezoelectric actuator element 10 are bridged as shown in FIG. 5. Coupling portion 40 positions in an approximately longitudinal center of an expansion direction of piezoelectric actuator element 10. The position, more preferably, corresponds to an antinode of a primary bending mode of thin film spaces 8a and 8b whose ends are respectively fixed on flexure substrate 3 and slider holder 3a. Additionally, ground wiring 9d around slit 30 is provided such that wirings on both sides of slit 30 are shorted to form wiring coupling portion 41 on flexible substrate 8c of coupling portion 40. The relationship between the width t and thickness h of wiring coupling portion 41 is set as h>t.

Each end of wirings 6a, 6b, 6c and 6d is formed on both sides of flexible substrate 8c by electroplating or the like to connect to magnetic head 1 mounted on slider 2 as shown in the cross-sectional view taken along the line A-A in FIG. 6. Additionally, ground wiring 9d is formed by the same method on both sides of slit 30 provided in the center of flexible substrate 8c. On the other hand, wiring coupling portion 41 is formed of ground wiring 9d in coupling portion 40 and is connected to ground wiring 9d on both sides of slit 30 as shown in the cross-sectional view including coupling portion 40 in FIG. 7.

Figure 8:
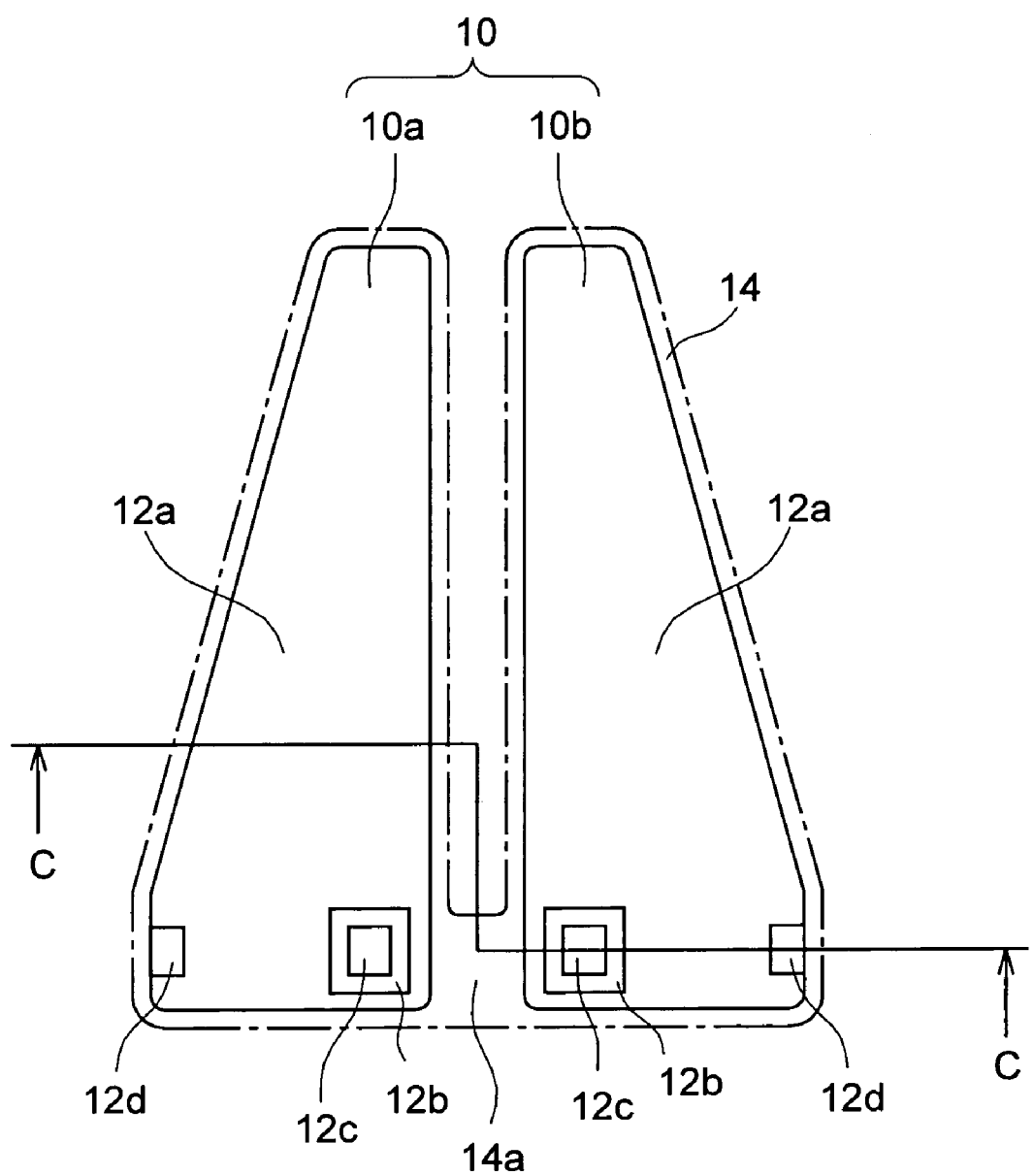
FIG. 8 is a plan view of a piezoelectric actuator element in accordance with the exemplary embodiment of the present invention.
Figure 9:
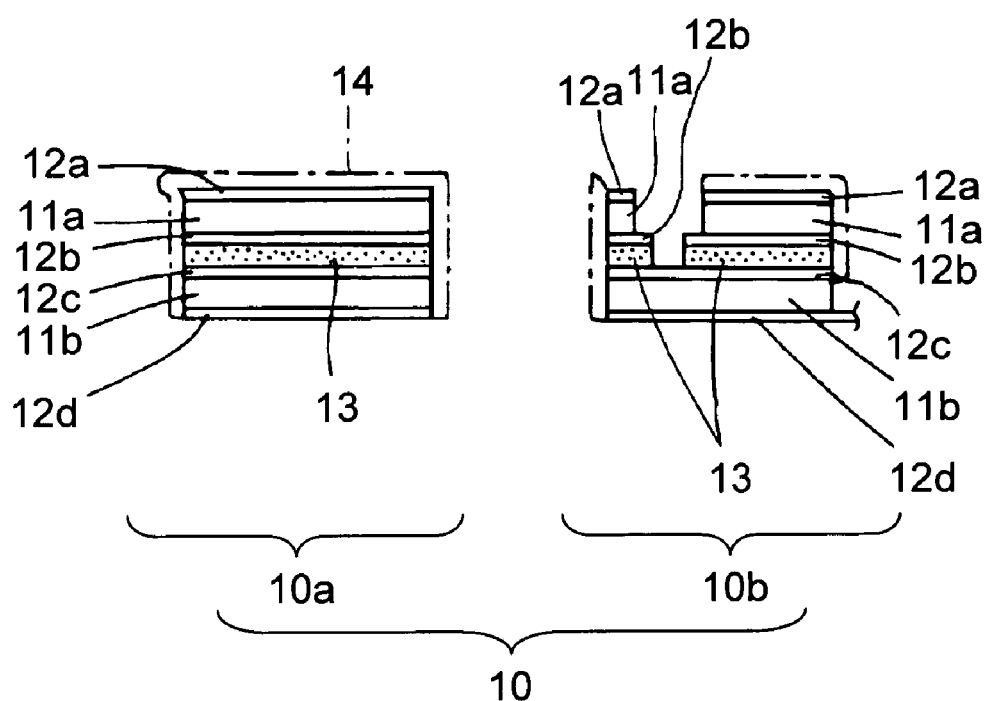
FIG. 9 is a cross-sectional view taken along the line C-C in FIG. 8.
Figure 10:
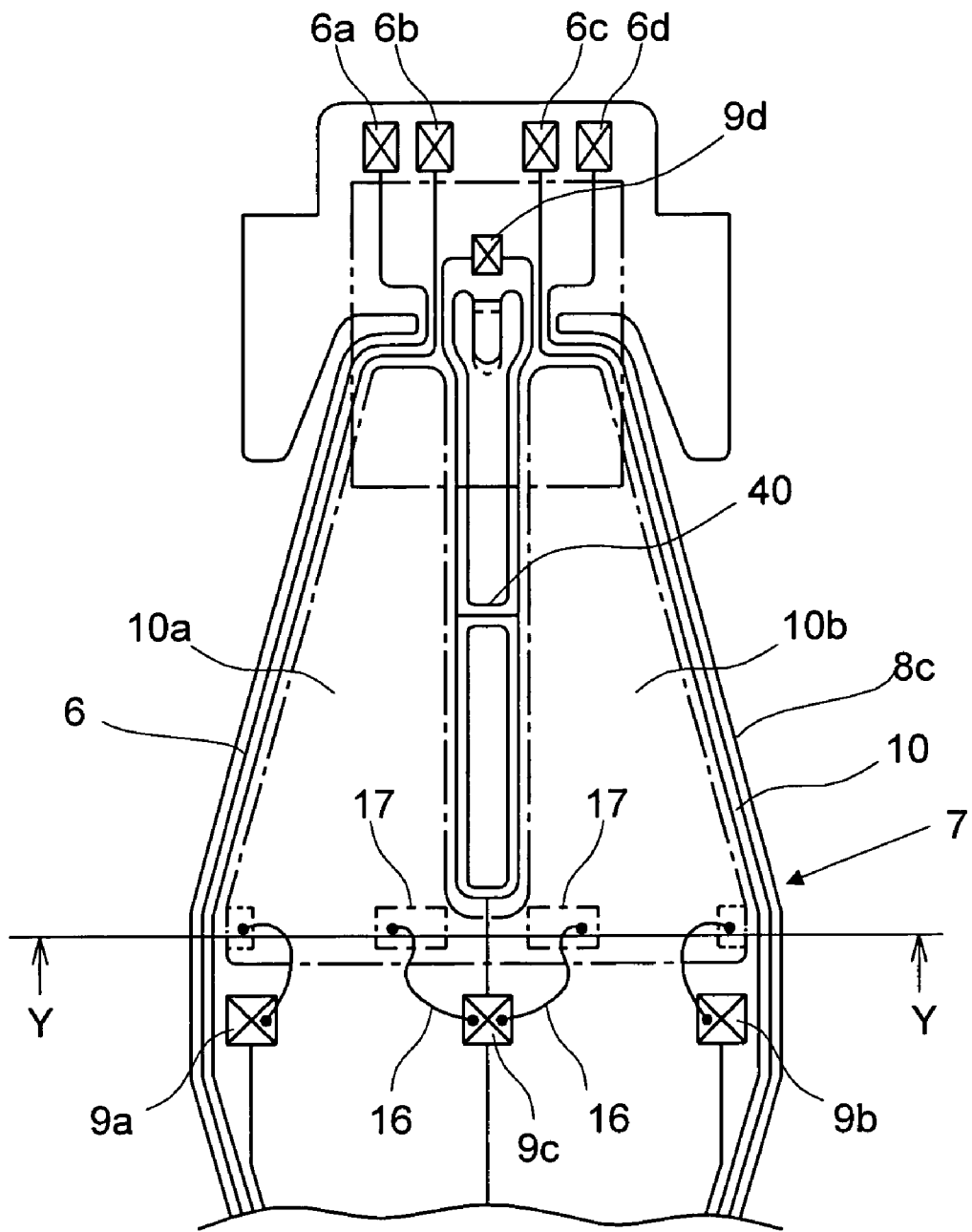
FIG. 10 is a plan view of the flexure attached with piezoelectric actuator elements in accordance with the exemplary embodiment of the present invention.

The piezoelectric actuator element 10 which is made of a thin film element used in the exemplary embodiment of the present invention will now be described. FIG. 8 is a plan view of piezoelectric actuator elements 10 disposed on thin film spaces 8a and 8b provided in head suspension assembly 100. Thin film piezoelectric actuator element 10 consists of a first piezoelectric element unit 10a and a second piezoelectric element unit 10b, which are both formed of thin film piezoelectric elements, and are disposed in mirror symmetry to each other. The entire thin film piezoelectric actuator element 10 is covered by using flexible coating resin 14. The first piezoelectric element unit 10a and second piezoelectric element unit 10b are coupled at their respective ends at joint 14a with coating resin 14. FIG. 9 is a cross-sectional view taken along the line C-C in FIG. 8. Piezoelectric actuator element 10 is bonded to thin film spaces 8a and 8b provided on flexible substrate 8c constituting flexure 7 (see FIG. 4). As shown in FIG. 10, piezoelectric actuator element 10 comprises a pair of first piezoelectric element unit 10a and second piezoelectric element unit 10b provided separately from each other on right and left sides. Both of first piezoelectric element unit 10a and second piezoelectric element unit 10b have a double layer structure that consists of a first thin film piezoelectric element 11a and a second thin film piezoelectric element 11b being multilayered. A first electrode metal layer 12a is formed on the top side of first thin film piezoelectric element 11a, and a second electrode metal layer 12b is formed on its bottom side. Similarly, a third electrode metal layer 12c a fourth electrode metal layer 12d are formed on both top and bottom sides of second thin film piezoelectric element 11b, disposed below first thin film piezoelectric element 11a. Second electrode metal layer 12b and third electrode metal layer 12c are bonded by using adhesive 13. The piezoelectric element unit having a double layer structure of thin film piezoelectric elements can contribute to produce a larger displacement on an applied voltage.

Figure 11:
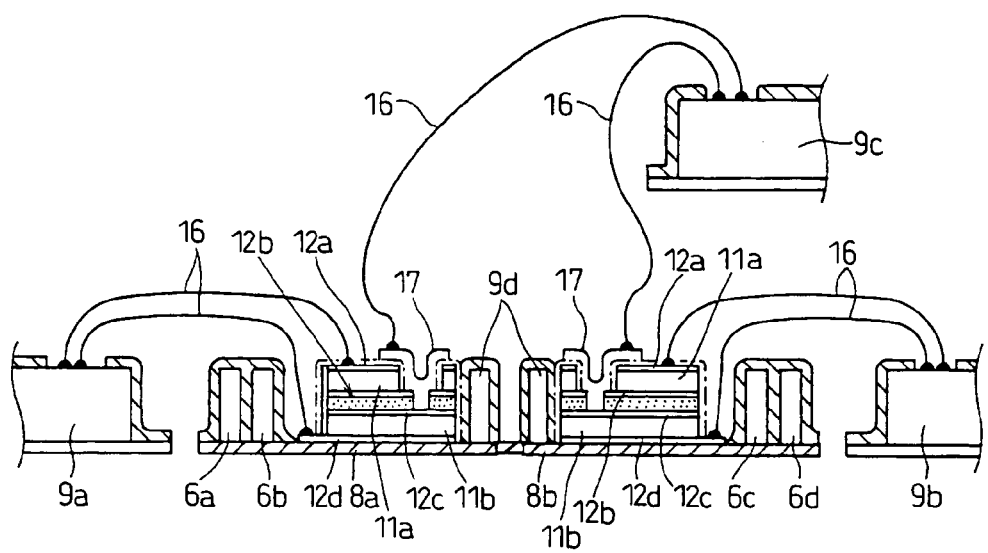
FIG. 11 is a cross-sectional view taken along the line Y-Y in FIG. 10.

FIG. 10 shows a plan view of flexure 7 attached with piezoelectric actuator elements 10 used in head suspension assembly 100 in accordance with the exemplary embodiment of the present invention when viewed from the bonding side of slider 2 (not shown). FIG. 11 is a cross-sectional view taken along the line Y-Y in FIG. 10, and shows a detailed wiring diagram of piezoelectric actuator elements 10. The piezoelectric actuator elements 10 shown in FIG. 8 are fixedly bonded, as indicated by the dashed line, on flexible substrate 8c provided with coupling portion 40 and surrounded by pattern formed wiring 6 as shown in FIG. 10.

Next, electrical wirings of piezoelectric actuator element 10 used in the exemplary embodiment of the present invention are described with reference to FIG. 11. In FIG. 9, first electrode metal layer 12a and fourth electrode metal layer 12d of piezoelectric actuator element 10 are charged positively, while second electrode metal layer 12b and third electrode metal layer 12c are grounded. First electrode metal layer 12a and fourth electrode metal layer 12d are respectively connected to thin film piezoelectric element driver wirings 9a and 9b provided on flexure 7 through bonding wire 16. Second electrode metal layer 12b and third electrode metal layer 12c are connected to thin film piezoelectric element driver wiring 9c through grounded metal layer 17. Grounded wiring 9d of slider 2, or a grounded terminal of slider 2, is shorted to thin film piezoelectric element driver wiring 9c. The other ends of these thin film piezoelectric element driver wirings 9a, 9b and 9c are connected to an external control circuit (not shown) through terminals mounted on terminal holder 7y.

Figure 12:
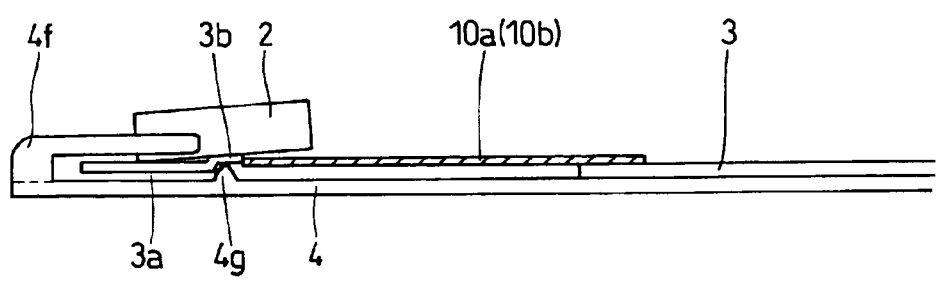
FIG. 12 is a side view of the head suspension assembly in accordance with the exemplary embodiment of the present invention.
Figure 13A:
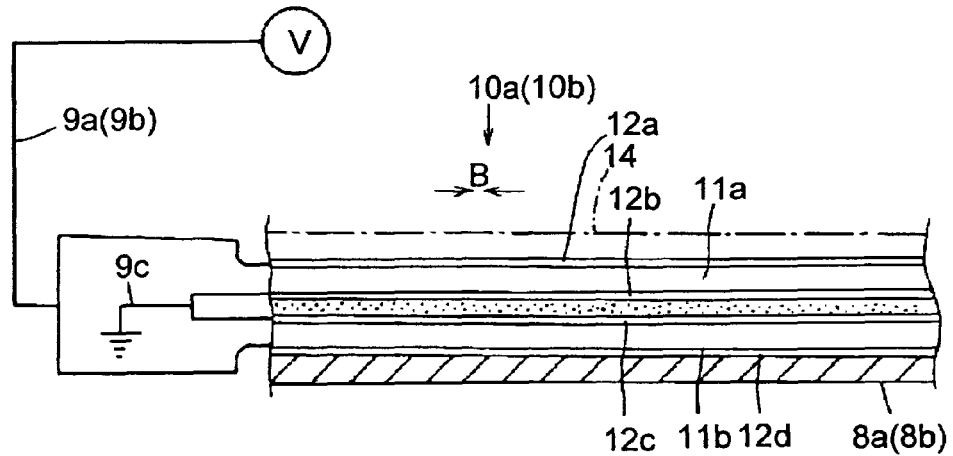
FIG. 13 (a) is a cross-sectional view of the piezoelectric actuator elements in accordance with the exemplary embodiment of the present invention.
Figure 13B:
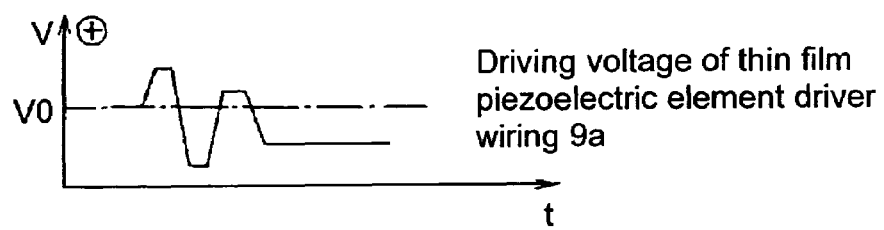
Figure 13C:
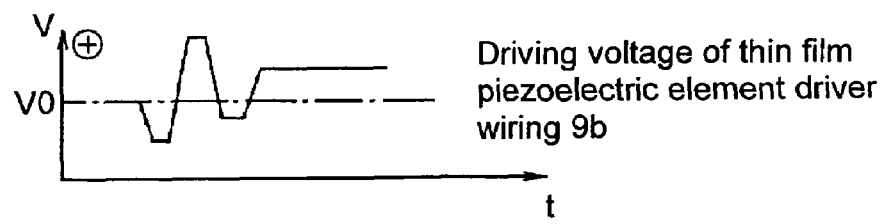
Figure 14:
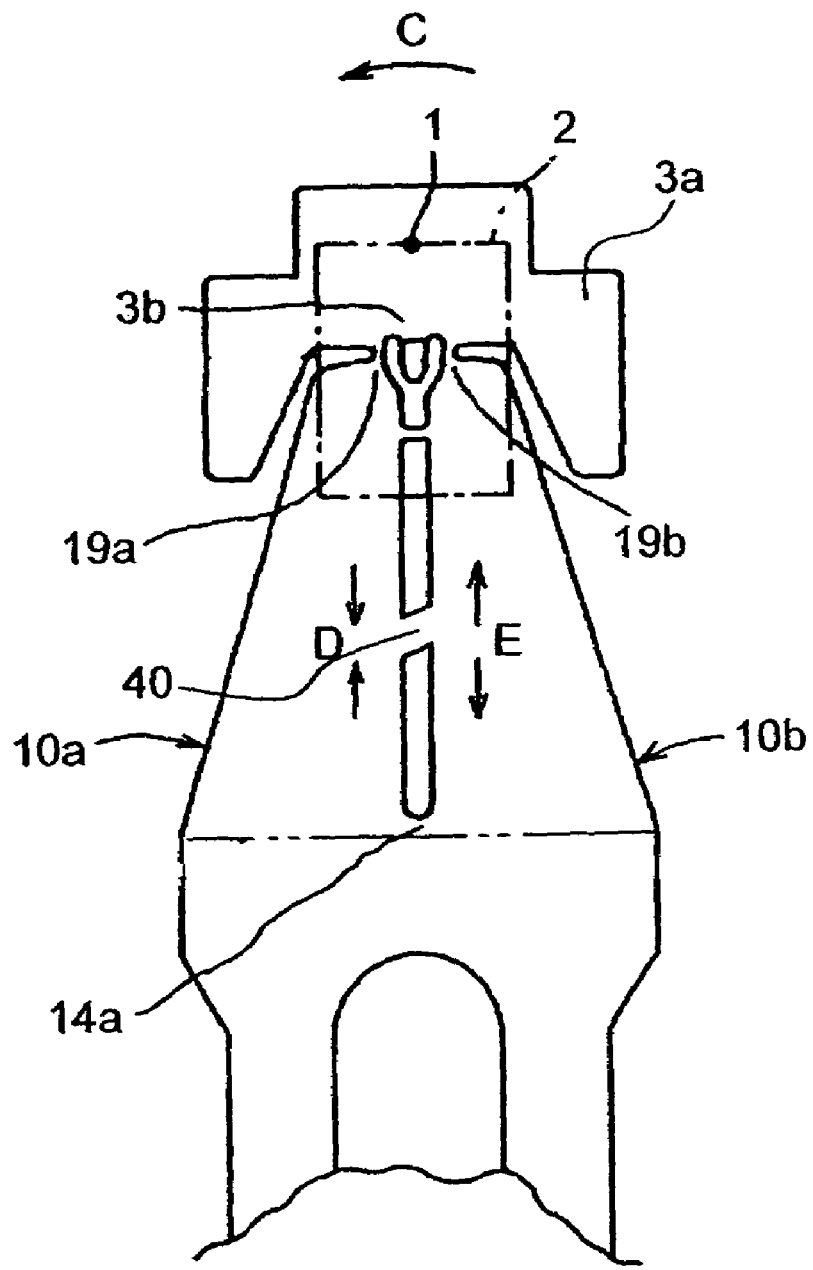
FIG. 14 is a general schematic view showing pivotal movements of the piezoelectric actuator in accordance with the exemplary embodiment of the present invention.

Next, a movement of head suspension assembly 100 is described with reference to FIGS. 12 to 14. FIG. 12 shows a side view of head suspension assembly 100 in accordance with the exemplary embodiment of the present invention. FIG. 13 shows a schematic sectional view of one of the piezoelectric element units constituting piezoelectric actuator element 10 and a schematic view for the applied voltage specification to describe the movement of head suspension assembly 100. FIG. 14 is a general schematic view to describe the movements of head suspension assembly 100.

Thin film piezoelectric element driver wiring 9c for piezoelectric element unit 10a or 10b of piezoelectric actuator element 10 is grounded as shown in FIG. 13 (a). Thin film piezoelectric element driver wirings 9a and 9b are supplied with driving voltage to drive first thin film piezoelectric element 11a and second thin film piezoelectric element 11b respectively as shown in FIGS. 13 (b) and (c). These driving voltages are opposite in phase to each other relative to the bias voltage $V_0$ as a neutral voltage. Upon application of the driving voltage, first thin film piezoelectric element 11a and second thin film piezoelectric element 11b contract in the direction indicated by arrow B as shown in FIG. 13 (a). Because voltages are applied for first thin film piezoelectric element 11a and second thin film piezoelectric element 11b in the polarization direction, first thin film piezoelectric element 11a and second thin film piezoelectric element 11b do not lose the properties owing to polarization turn over. Also, when an applied voltage is low enough not to cause polarization turn over, either plus or minus voltage can be applied on thin film piezoelectric element driver wiring 9a and 9b without influencing any damage in the property.

FIG. 14 illustrates a pivotal movement of slider 2 when second piezoelectric element unit 10b expands while first piezoelectric element unit 10a contracts.

When second piezoelectric element unit 10b expands in the direction indicated by arrow E and first piezoelectric element unit 10a contracts in the direction indicated by arrow D, slider 2 and slider holder 3a move pivotally in the direction indicated by arrow C, causing dimple 4g, which is pressed to touch projection 3b, to act as a rotational center. Consequently, magnetic head 1 mounted on slider 2 moves across the width of track provided concentrically on a disk. Therefore, when magnetic head 1 is not correctly positioned on tracks due to a misalignment, magnetic head 1 can be moved to trace the target tracks, which results in a good "on-track property" with a high accuracy.

Plate spring 4e, shown in FIG. 2, of load beam 4 applies a load on the order of 20 mN to 30 mN on slider 2. Upon pivotal movements of slider holder 3a, the load acts on dimple 4g and slider holder 3a. Therefore, a frictional force which is determined by a friction factor between slider holder 3a and dimple 4g affects slider holder 3a. The frictional force prevents projection 3b of slider holder 3a and dimple 4g from occurring out-of-alignment.

Figure 15A:
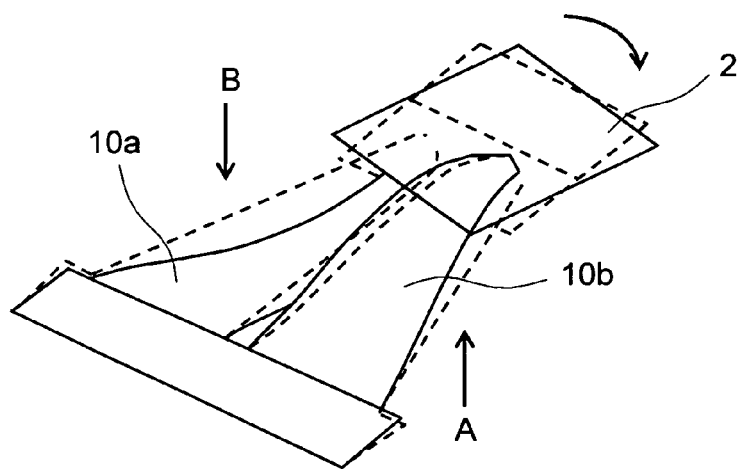
FIG. 15 (a) is a perspective pattern view showing a fundamental vibration mode of a conventional piezoelectric actuator element.
Figure 15B:
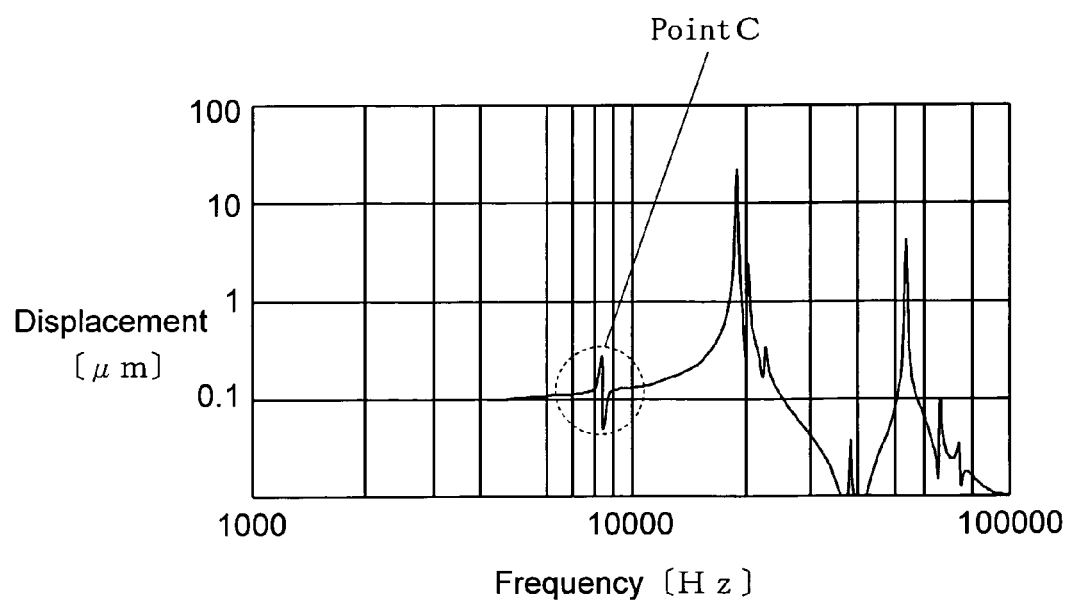

FIGS. 15 (a) and 16 (a) show schematic patterns of a primary bending mode and a fundamental vibration mode of piezoelectric element unit 10 having its ends fixed on flexure substrate 3 and slider holder 3a, respectively, and FIGS. 15 (b) and 16 (b) show frequency characteristics of these cases.

FIG. 15 shows a case when first piezoelectric element unit 10a and second piezoelectric element unit 10b stay in a free state. This case, which is different from the exemplary embodiment of the present invention, arises when coupling portion 40 is not provided on flexible substrate 8c to be equipped with piezoelectric actuator element 10. In such a structure, an extension/contraction movement of piezoelectric element unit 10a and 10b causes a primary bending mode vibration phenomenon, which is a wavy motion in that one piezoelectric element unit bends upward while another piezoelectric element unit bends downward as indicated by arrows A and B, as a fundamental vibration mode. Consequently, an unstable phenomenon due to resonance of actuator elements occurs in low frequencies as shown in point C in FIG. 15 (b).

A highly accurate positioning can not be performed due to losses generated in displacements by such resonance, because a neutral axis position of rigidity differs in an area equipped with piezoelectric actuator element 10 in flexible substrate 8c and an area equipped with flexible substrate 8c in slider holder 3a.

Figure 16A:
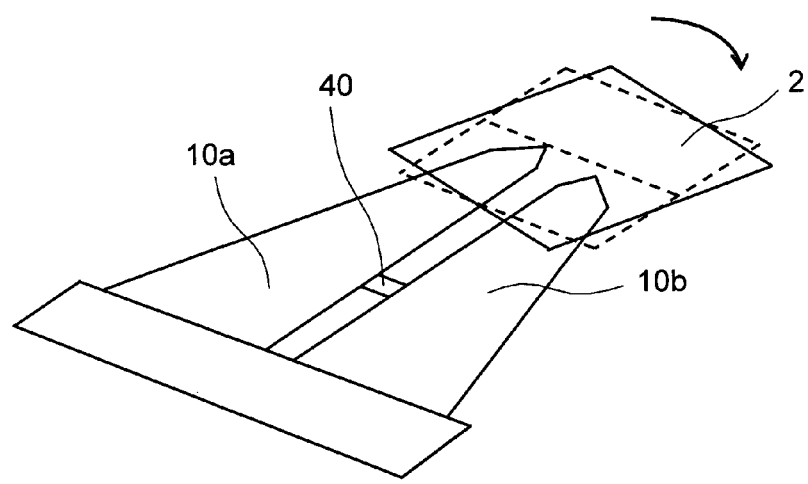
FIG. 16 (a) is a perspective pattern view showing a fundamental vibration mode of the piezoelectric actuator element in accordance with the exemplary embodiment of the present invention.
Figure 16B:
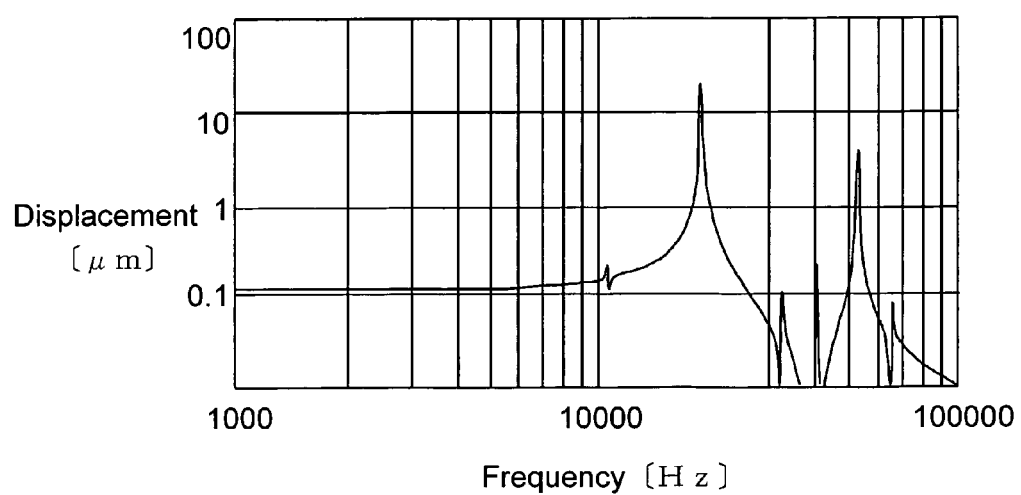

On the other hand, FIG. 16 (a) shows schematic patterns of a fundamental vibration mode of the piezoelectric actuator in a case when coupling portion 40 is provided on flexible substrate 8c equipped with piezoelectric actuator element 10 in accordance with the exemplary embodiment of the present invention, and FIG. 16 (b) shows a frequency characteristic of the case. Coupling portion 40 positions in an approximately longitudinal center of first piezoelectric element unit 10a and second piezoelectric element unit 10b, and more preferably, positions corresponding to an antinode of a bending mode generating the aforementioned wavy resonance. FIG. 16 shows clearly that the introduction of coupling portion 40 can perform a high frequency resonance characteristic due to suppression of the wavy vibration phenomenon and the resonance phenomenon in a low frequency domain. Therefore, piezoelectric element units extend and contract in a same plane, causing no losses and out-of-alignment in displacement generated by an extension/contraction movement, which enables a stable operation with a high accuracy to be performed.

Coupling portion 40 must not have any resistance for the extension/contraction movements when piezoelectric element units 10a and 10b extend or contract in respectively opposite directions, but must have a rigidity that is high enough to suppress the fundamental vibration of the bending mode. In the exemplary embodiment of the present invention, wiring coupling portion 41 is formed on flexible substrate 8c of coupling portion 40 to short ground wiring 9d provided on both sides of slit 30 as shown in FIG. 5. In addition, the relationship between width t and thickness h of wiring coupling portion 41 is designed as h>t. Therefore, wiring coupling portion 41 can have a larger rigidity in the thickness direction, and first piezoelectric element units 10a and second piezoelectric element units 10b can have a smaller rigidity in the longitudinal direction, respectively. Consequently, a stable operation can be performed by suppressing the wavy resonance phenomenon without hampering the extension/contraction movements exerted from the piezoelectric elements.

Figure 17:
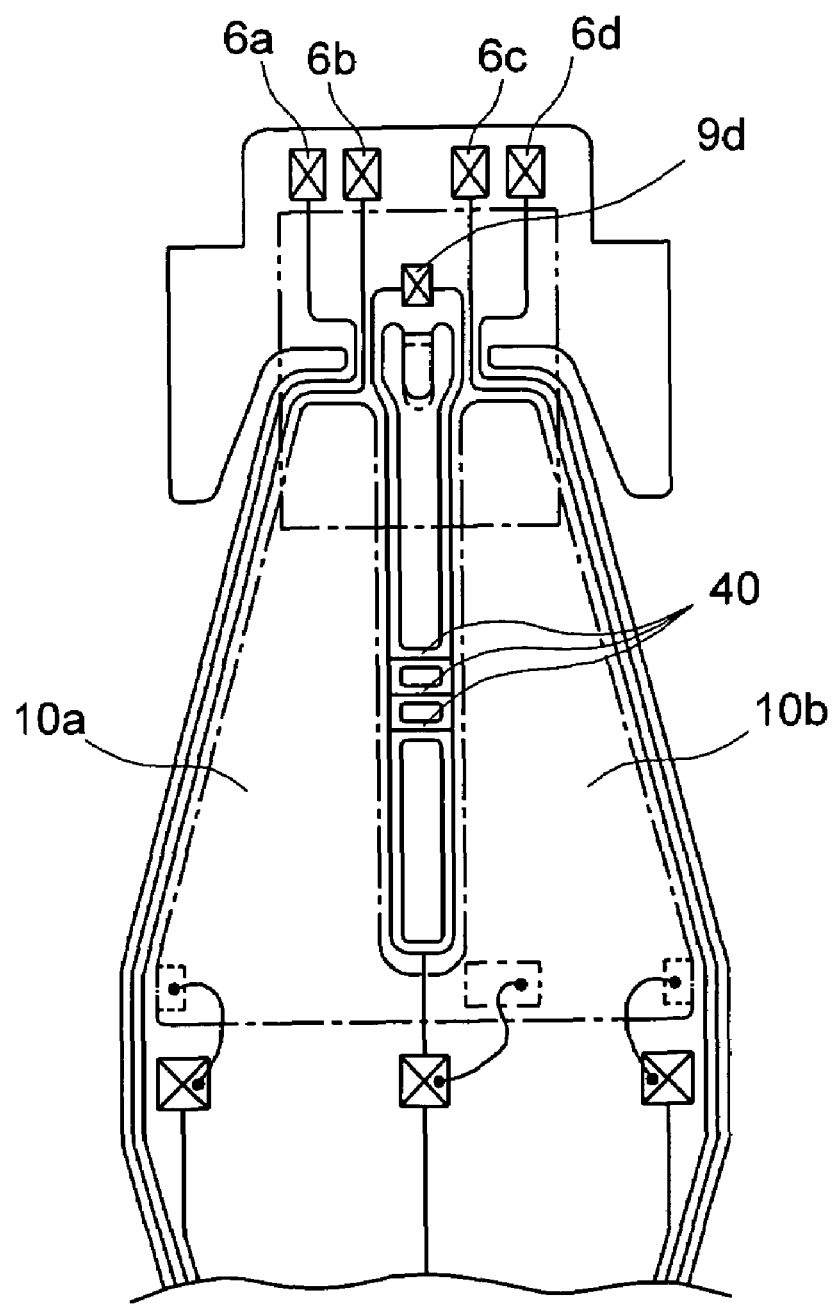
FIG. 17 is a plan view of the flexure attached with piezoelectric actuator elements in accordance with another exemplary embodiment of the present invention.

Another exemplary embodiment of coupling portion 40 is given in FIG. 17, showing a plan view of flexure 7 attached with piezoelectric actuator elements 10, when viewed from the bonding side of slider as in FIG. 10. The exemplary embodiment shows a structure having a plurality of ladder shaped coupling portions 40. A plurality of coupling portions can contribute to an optimization of the strength and flexibility of the coupling portion.

Figure 18:
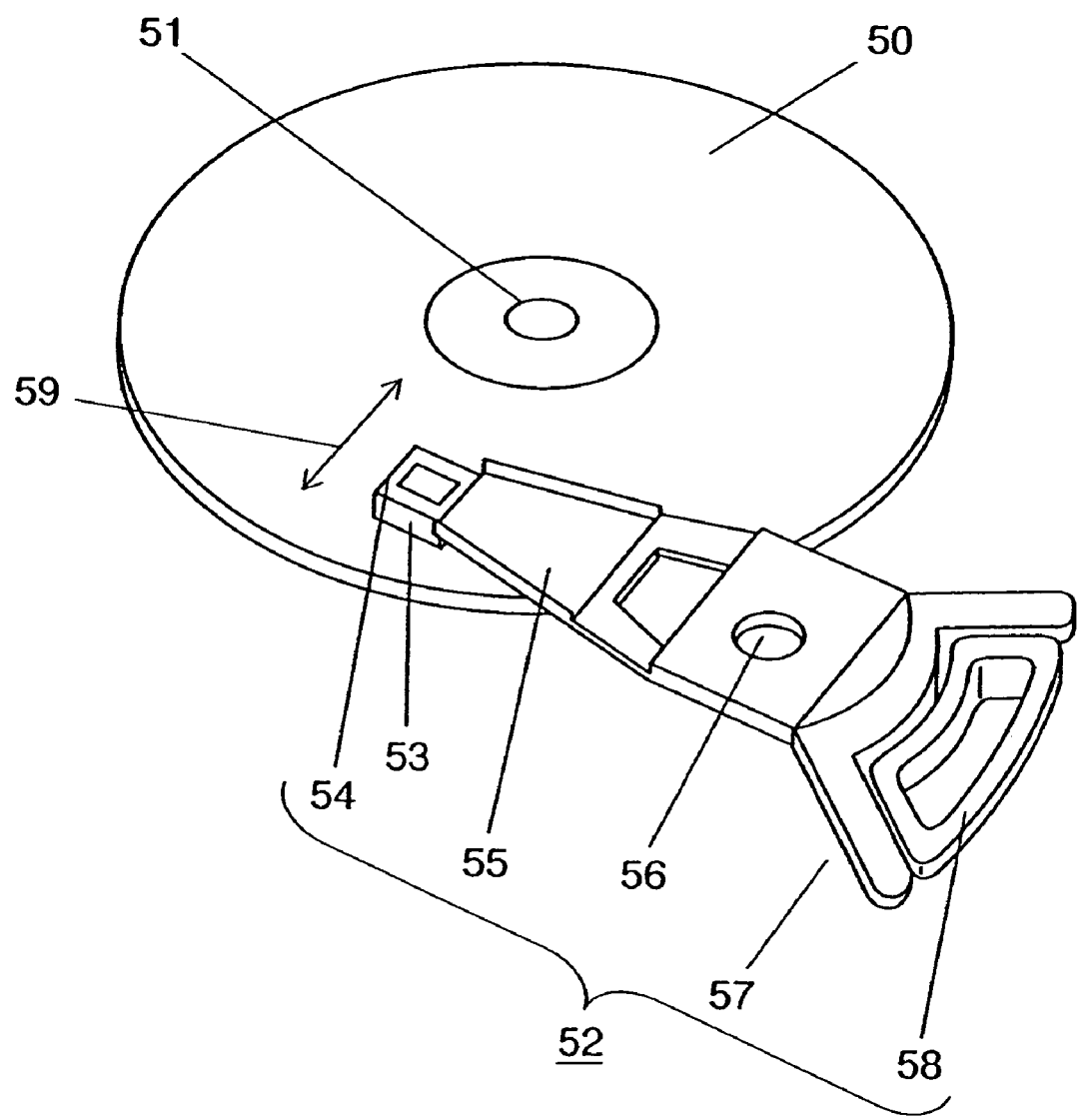
FIG. 18 is a perspective view of a disk drive in accordance with the exemplary embodiment of the present invention.

FIG. 18 shows a disk drive in accordance with the exemplary embodiment of the present invention. Disk 50, which is fixed to main shaft 51, is rotationally driven by a drive means (not shown) directly secured to main shaft 51. A spindle motor, for instance, is used for the drive means.

Head actuator 52 comprises head slider 53 equipped with a magnetic head (not shown) and suspension arm 55 (load beam) attached with flexure 54, wherein flexure 54 is fixed to head slider 53 on its distal end. Suspension arm 55, having the first positioning means or pivotally driving means 57 on its other end, is mounted to bearing 56 having a freely pivotable movement. A voice coil motor having a flat coil 58 is used for pivotal driving means 57. Driving means 57 moves suspension arm 55 above the surface of disk 50 pivotally as indicated by arrow 59 to transport head slider 53 to target tracks on disk 50 accurately and to trace tracks by the magnetic head. Moreover, head actuator 52 discussed in FIGS. 1 to 11 in the exemplary embodiment has head slider 53 to carry out a fine displacement for positioning at target tracks acting as the second positioning means. The configuration can perform a fine positioning on a disk with a high accuracy and can contribute to provide a downsized disk drive having a large storage capacity.

As mentioned above, the piezoelectric actuator used in the exemplary embodiment of the present invention has a structure that can reinforce the bending mode of the piezoelectric actuator and can suppress the bending resonance caused by the movements of respective piezoelectric element units in opposite directions.

Therefore, the invention disclosed can produce the piezoelectric actuator with high frequency resonance characteristics capable of positioning on the disk accurately and can provide an excellent downsized disk drive with a large storage capacity using the piezoelectric actuator.

What is claimed is:

1. A piezoelectric actuator comprising:
a flexible substrate including a slit so as to form a first flexible substrate and a second flexible substrate, said first and second flexible substrates being positioned in and along a same plane and being separated by the slit;
a first piezoelectric element unit disposed on said first flexible substrate;
a second piezoelectric element unit disposed on said second flexible substrate approximately in parallel with said first piezoelectric element unit such that said first and second piezoelectric element units are separated from each other by the slit; and
a coupling portion that extends across the slit and couples said first flexible substrate to said second flexible substrate to suppress a wavy resonance phenomenon of said first flexible substrate and said second flexible substrate, wherein said coupling portion is positioned to correspond to a location of an antinode of a primary bending mode of said first piezoelectric element unit and said second piezoelectric element unit, wherein each of said first and second piezoelectric element units includes a first end and a second end, wherein said first and second ends of said first piezoelectric element unit are fixed on said first flexible substrate, and wherein said first and second ends of said second piezoelectric element unit are fixed on said second flexible substrate.

2. The piezoelectric actuator according to claim 1, wherein said coupling portion is composed of a wiring material provided on said first and second flexible substrates.

3. The piezoelectric actuator according to claim 1, wherein said coupling portion is constructed by a plurality of ladder shaped coupling portions.

4. The piezoelectric actuator according to claim 2, wherein said wiring material is in common use for said first piezoelectric element unit and said second piezoelectric element unit.

5. The piezoelectric actuator according to claim 1, wherein said coupling portion is provided across said first and second flexible substrates, and the thickness of said coupling portion is larger than the width of said coupling portion.

6. The piezoelectric actuator according to claim 1, wherein said first piezoelectric element unit and said second piezoelectric element unit are configured to move in opposite directions with respect to each other.

7. The piezoelectric actuator according to claim 1, wherein said first piezoelectric element unit and said second piezoelectric element unit each comprise a thin film piezoelectric body.

8. The piezoelectric actuator according to claim 7, wherein said first piezoelectric element unit and said second piezoelectric element unit form a multilayered structure including two thin film piezoelectric element bodies, each of the bodies comprising a thin film piezoelectric element covered by a metal coating layer on top and bottom surfaces of the bodies, with an adhesive layer sandwiched between the top and bottom surfaces of the bodies.

9. A disk drive comprising:
(a) a disk;
(b) a head slider equipped with a magnetic head;
(c) a flexure to fix said head slider;
(d) an arm to be fixed with said flexure;
(e) a first positioning device configured to move said arm through a rough displacement; and
(f) a second positioning device configured to make said head slider fixed on said arm perform a fine displacement,
wherein said second positioning device is composed of an actuator having a piezoelectric element, and said actuator is the piezoelectric actuator according to claim 1.

10. A disk drive comprising:
(a) a disk;
(b) a head slider equipped with a magnetic head;
(c) a flexure to fix said head slider;
(d) an arm to be fixed with said flexure;
(e) a first positioning device configured to move said arm through a rough displacement; and
(f) a second positioning device configured to make said head slider fixed on said arm perform a fine displacement,
wherein said second positioning device is composed of an actuator having a piezoelectric element, said actuator being said piezoelectric actuator according to claim 2.

11. A disk drive comprising:
(a) a disk;
(b) a head slider equipped with a magnetic head;
(c) a flexure to fix said head slider;
(d) an arm to be fixed with said flexure;
(e) a first positioning device configured to move said arm through a rough displacement; and
(f) a second positioning device configured to make said head slider fixed on said arm perform a fine displacement,
wherein said second positioning device is composed of an actuator having a piezoelectric element, said actuator being said piezoelectric actuator according to claim 3.

12. A disk drive comprising:
(a) a disk;
(b) a head slider equipped with a magnetic head;
(c) a flexure to fix said head slider;
(d) an arm to be fixed with said flexure;
(e) a first positioning device configured to move said arm through a rough displacement; and
(f) a second positioning device configured to make said head slider fixed on said arm perform a fine displacement,
wherein said second positioning device is composed of an actuator having a piezoelectric element, said actuator being said piezoelectric actuator according to claim 4.

13. A disk drive comprising:
(a) a disk;
(b) a head slider equipped with a magnetic head;
(c) a flexure to fix said head slider;
(d) an arm to be fixed with said flexure;
(e) a first positioning device configured to move said arm through a rough displacement; and
(f) a second positioning device configured to make said head slider fixed on said arm perform a fine displacement,
wherein said second positioning device is composed of an actuator having a piezoelectric element, said actuator being said piezoelectric actuator according to claim 5.

14. A disk drive comprising:
(a) a disk;
(b) a head slider equipped with a magnetic head;
(c) a flexure to fix said head slider;
(d) an arm to be fixed with said flexure;
(e) a first positioning device configured to move said arm through a rough displacement; and
(f) a second positioning device configured to make said head slider fixed on said arm perform a fine displacement,
wherein said second positioning device is composed of an actuator having a piezoelectric element, said actuator being said piezoelectric actuator according to claim 6.

15. A disk drive comprising:
(a) a disk;
(b) a head slider equipped with a magnetic head;
(c) a flexure to fix said head slider;
(d) an arm to be fixed with said flexure;
(e) a first positioning device configured to move said arm through a rough displacement; and
(f) a second positioning device configured to make said head slider fixed on said arm perform a fine displacement,
wherein said second positioning device is composed of an actuator having a piezoelectric element, said actuator being said piezoelectric actuator according to claim 7.

16. A disk drive comprising:
(a) a disk;
(b) a head slider equipped with a magnetic head;
(c) a flexure to fix said head slider;
(d) an arm to be fixed with said flexure;
(e) a first positioning device configured to move said arm through a rough displacement; and
(f) a second positioning device configured to make said head slider fixed on said arm perform a fine displacement,
wherein said second positioning device is composed of an actuator having a piezoelectric element, said actuator being said piezoelectric actuator according to claim 8.

* * * * *